(12) United States Patent
Kahn et al.

(10) Patent No.: US 6,238,537 B1
(45) Date of Patent: May 29, 2001

(54) ION ASSISTED DEPOSITION SOURCE

(75) Inventors: James R. Kahn; Viacheslav V. Zhurin, both of Ft. Collins, CO (US)

(73) Assignee: Kaufman & Robinson, Inc., Ft. Collins, CO (US)

( * ) Notice: Subject to any disclaimer, the term of this patent is extended or adjusted under 35 U.S.C. 154(b) by 0 days.

(21) Appl. No.: 09/548,756

(22) Filed: Apr. 13, 2000

Related U.S. Application Data

(63) Continuation-in-part of application No. 09/192,840, filed on Nov. 16, 1998, now abandoned.
(60) Provisional application No. 60/095,521, filed on Aug. 6, 1998.

(51) Int. Cl.[7] .............................. C23C 14/35; C23C 14/34
(52) U.S. Cl. ................ 204/598.04; 204/298.06; 204/298.16; 204/298.14
(58) Field of Search ............... 204/192.11, 192.12, 204/298.06, 298.04, 298.16, 298.14, 298.07, 298.08

(56) References Cited

U.S. PATENT DOCUMENTS

| | | | |
|---|---|---|---|
| 4,103,042 | * 7/1978 | Winters | 427/38 |
| 5,346,600 | * 9/1994 | Nieh et al. | 204/192.3 |
| 5,840,167 | * 11/1998 | Kim | 204/298.05 |

* cited by examiner

Primary Examiner—Nam Nguyen
Assistant Examiner—Steven H. VerSteeg
(74) Attorney, Agent, or Firm—Dean P. Edmundson

(57) ABSTRACT

In accordance with one specific embodiment of the present invention, the ion assisted deposition source for thin films comprises an axially symmetric discharge region into which an ionizable gas is introduced, a sputter target at one end of that region, an axially symmetric magnetic field within and extending out the opposite and open end of that region, an anode around the circumference of that region, and an electron emitting cathode located near the open end of that region. Particles are sputtered from the sputter target, pass through the discharge region, and are deposited on a deposition substrate located exterior of both the discharge region and the deposition source. A beam of energetic ions from the discharge region bombards the film being deposited to improve the adhesion, density, and other properties of that film. The density of the plasma can be controlled with the emission from the cathode, the emission of sputtered particles from the sputter target can be controlled with the negative potential of that target, while the energy of the ions used to assist in the deposition can be controlled with the positive potential of the anode. The deposition source thus simultaneously generates a flux of sputtered material with which to deposit a film on a substrate and a beam of energetic ions to assist in that deposition, and does so with a simple and economical apparatus.

12 Claims, 4 Drawing Sheets

ION ASSISTED DEPOSITION SOURCE

CROSS REFERENCE TO RELATED APPLICATIONS

This application is a continuation-in-part of our Application Ser. No. 09/192,840, filed Nov. 16, 1998, now abandoned which is based upon, and claims priority from, our provisional application Ser. No. 60/095,521, filed Aug. 6, 1998.

FIELD OF INVENTION

This invention relates generally to the deposition of thin films, and more particularly to the enhanced properties obtained by the bombardment of the deposition surface with energetic ions before, during, or after the deposition. This process is also known as ion assisted deposition.

This invention can be utilized in a variety of thin film applications such as the deposition of decorative or protective films, the deposition of films with specific refractive indexes for optical applications, the deposition of conducting films for solid state electronics, or the deposition of magnetic films for recording heads or recording media.

BACKGROUND ART

The ion assisted deposition of a thin film has been recognized as a means of improving or controlling a variety of thin film properties such as adhesion, density, stress, or even the selection of a preferred form of molecular bonds as in the deposition of diamondlike carbon. Some examples of ion assisted deposition are described in an article by Harper, et al. which appeared in the book *Ion Bombardment Modification of Surfaces: Fundamentals and Applications,* O. Auciello and R. Kelly, eds., Elsevier Science Publishers B. V., Amsterdam, 1984, beginning on page 127. The range of 1–100 eV/atom was indicated as the range of interest for the modification of thin film properties in the aforementioned article. Note that this range is eV/atom, which equals the total ion energy arriving at the target divided by the number of atoms that have been deposited. The same ion energy can be obtained with either a few ions arriving at high energy or many ions arriving at low energy.

Ion assisted deposition is typically carried out with complicated apparatus that uses separate devices to perform the deposition and ion assist functions.

The deposition function could use material from a cathodic arc as described in U.S. Pat. NO. 5,279,723—Falabella, et al. As an alternative, the deposition could use material from a magnetron as described in the article by Thornton in the Journal of Vacuum Science and Technology, Vol. 15 (1978), beginning on page 171, or an improved magnetron as described in U.S. Pat. No. 4,588,490—Cuomo, et al. As another alternative, the deposition could use material sputtered from a target that is bombarded by an energetic ion beam from a gridded ion source as described in an article by Kaufman, et al., in the *AIAA Journal,* Vol. 20 (1982), beginning on page 745.

The energetic ions to perform the ion assisted function may be from a gridded ion source as described in the above article by Kaufman, et al. The energetic ions may also come from a gridless ion source as described in U.S. Pat. No. 4,862,032—Kaufman, et al. Finally, the energetic ions may come from a background plasma, with the energy supplied by a negative bias on the deposition substrate.

While the energetic ions for the ion assisted function may come from different kinds of ion sources, the range of ion energy consistent with low damage to the deposited film is more limited. A variety of ion assisted deposition applications is described in the book *Handbook of Ion Beam Processing technology,* J. J. Cuomo, S. M. Rossnagel, and H. R. Kaufman, eds., see for example chapters beginning on pages 170, 194, and 373 by E. Kay and S. M. Rossnagel, R. A. Roy and D. S. Yee, and P. J. Martin and R. J. Netterfield, respectively. The maximum energy level for acceptably low damage, either in the film being deposited or the substrate upon which it is deposited, depends on the particular application, but is below about 200–300 eV/ion. In general, then, the energetic ions for the ion assisted function should be below about 200 eV/ion. Please note that this energy is electron-volts per ion, which is separate and distinct from electron-volts per atom.

It should be obvious that various combinations of the above deposition and ion assist devices may be used, examples of which have been incorporated herein by reference. In some cases, there may be differences in operating regimes that require additional apparatus, such as differential pumping to permit a difference in operating pressure for different devices when used simultaneously in the same ion assisted deposition process. Using separate devices as described above for the separate deposition and ion assist functions can result in bulky, complicated, and expensive apparatus.

Attempts have been made to integrate different aspects of the deposition and ion bombardment functions. The above-mentioned cathodic arc and magnetron are devices that integrate a target of the material to be deposited with a source of energetic plasma or ions to sputter or otherwise disperse that target material. Thus, to that extent, they are integrated devices compared to the use of a separate gridded source and target as a source of deposition material.

An attempt to integrate all aspects of ion assisted deposition is described by U.S. Pat. No. 4,911,814—Matsuoka, et al. But this attempt has the serious shortcomings of requiring two sputter targets of the same material, a dielectric window that must be protected from sputtered material, and an electromagnet sufficient to generate a magnetic field of about 875 gauss over a substantial volume of the discharge region. These shortcomings result from the use of microwave power to generate the plasma.

There are other problems with prior art. One is that the deposition substrate may include insulating layers which prevent the use of substrate bias for the ion assist function. Another is that excessively high operating pressures are sometimes required in the deposition region, so that material sputtered from the deposition substrate by the energetic ions performing the ion assist function may return to the deposition substrate, thereby increasing the contamination in the thin film being deposited. Yet another is that some devices require large gas flows, resulting in larger, more expensive vacuum pumps.

There can be problems with the cathodic arc described in the aforesaid U.S. Pat. No. 5,279,723—Falabella, et al. or as described in a review article by Sanders in the *Journal of Vacuum Science and Technology,* Vol. A7 (1989), beginning on page 2339. While the deposition rates can be quite high for cathodic arcs, they consistently eject macroparticles that degrade the quality of the thin films being deposited. The processes responsible for the production of macroparticles are complicated, but they are clearly associated with the cathodic arc and the large electron emission from the target that is required to sustain this arc. While the aforementioned article by Sanders in the *Journal of Vacuum Science and*

*Technology* teaches filter means for removing these macroparticles, the filter means substantially increases the complexity of the apparatus while decreasing the output of material to be deposited.

There is also prior art that pertains to deposition but differs in important aspects from the invention herein. One example of such prior art is described in U.S. Pat. No. 5,840,167—Kim and differs in using only ions of the sputtered material, as opposed to ion-assist ions of another species, e.g., argon ions. The aforesaid patent also differs in using electrostatic acceleration of only the ionized sputtered material. The accelerated current is very sensitive to acceleration voltage in electrostatic acceleration—it varies as the three-halves power of voltage. This is why the high voltage of 1000 volts was found necessary by Kim to achieve useful ion currents. The deceleration of the ions subsequent to their acceleration serves to reduce ion energies to less damaging values while retaining the high ion current obtained by using the high acceleration voltage. Because of the use of electrostatic acceleration, the deceleration is a necessary step. The use of deceleration increases the complexity of the apparatus, adds one or more power supplies (two in the case of Kim), and is present in all embodiments. Even with the two stages of deceleration of 200 V each, the net ion energy would be 600 eV/ion, which is excessive for applications that require low damage to the deposited film.

Another example of prior art that pertains to deposition but differs in important aspects from the invention herein is U.S. Pat. No. 5,346,600—Nieh, et al., wherein the acceleration of assist ions is obtained by biasing the deposition substrate negative relative to the surrounding vacuum chamber, which requires that the deposition substrate be a conductor. The generation of assist ions also takes place throughout the vacuum chamber in which the apparatus is installed. This means that a high pressure fills that chamber, rather than being limited to the interior of a piece of apparatus (the ion source) within that chamber, which results in the deposition taking place at a high background pressure and therefore incorporating the contaminants of that high pressure. To aid in the ionization throughout the vacuum chamber, the vacuum enclosure has a magnetic field at the walls of the enclosure. (There is no special requirement for the vacuum enclosure used in the present invention.) Consistent with the generation of ions throughout the vacuum chamber, the ions reach the work piece without any significant directed energy as would be associated with an ion beam and therefore acquire energy only as the result of the work piece being biased, i.e., because the target is a conductor.

SUMMARY OF INVENTION

In light of the foregoing, it is an overall general object of the invention to provide an improved apparatus that integrates the deposition and ion assist functions into a single source and to do so with an apparatus that is simple, reliable, and economical.

Another object of the present invention is to provide an apparatus that permits some of the energetic ions to consist of sputtered particles that have become ionized by passing through a discharge region.

A further object of the present invention is to provide an apparatus that permits a low pressure in the deposition region, and thereby reduces the contamination in the thin film deposited on the substrate.

Still another object of the present invention is to provide an ion beam for the ion assist function with ions of less than 200 eV/ion to minimize damage to the deposited film.

Yet another object of the present invention is to provide an apparatus that reduces the overall gas flow required and thereby reduces the vacuum pumping requirement.

A more specific object of the present invention is to avoid any need for a dielectric window that can be rendered inoperative by being covered with sputtered material.

A further specific object of the present invention is to avoid any need for a large electromagnet.

Yet another specific object of the present invention is to avoid the production of macroparticles that can degrade the quality of thin films.

In accordance with one specific embodiment of the present invention, the ion assisted deposition source comprises a discharge region into which an ionizable gas is introduced, a sputter target at one end of that region, an axially symmetric field within and extending out the opposite and open end of that region, an anode around the circumference of that region, and an electron emitting cathode located near the open end of that region. Particles are sputtered from the sputter target, pass through the discharge region, and are deposited on a deposition substrate located exterior of both the discharge region and the deposition source. A beam of energetic ions from the discharge region bombards the film being deposited to improve the adhesion, density, and other properties of that film. Some of these ions consist of sputtered particles that have become ionized while passing through the discharge region. There are additional interactions to consider in controlling the deposition source, but the density of the plasma in the discharge region can be controlled with the level of emission from the electron emitting cathode, the emission of sputtered particles from the sputter target can be controlled with the negative potential of that target, while the energy of the ions used to assist in the deposition can be controlled with the positive potential of the anode. The deposition source thus simultaneously generates a flux of sputtered material with which to deposit a film on a substrate and a beam of energetic ions to assist in that deposition, and does so with a simple and economical apparatus. Further, the current and energy of ions in the ion beam are adjustable relative to the flux of sputtered material, so as to provide a wide range of property modifications in the deposited film. It is therefore possible to bombard the deposition surface prior to, during, or after deposition.

BRIEF DESCRIPTION OF FIGURES

Features of the present invention which are unique are set forth with particularity in the appended claims. The organization and manner of operation of the invention, together with further objectives and advantages thereof, may be understood by reference to the following descriptions of specific embodiments thereof taken in connection with the accompanying drawings, in the several figures of which like reference numerals identify like elements and in which:

It may be noted that the aforesaid schematic cross-sectional views represent the surfaces in the plane of the section while avoiding the clutter which would result were there also a showing of the background edges and surfaces of the overall generally-cylindrical-assemblies.

DESCRIPTION OF PRIOR ART

Figure 1:
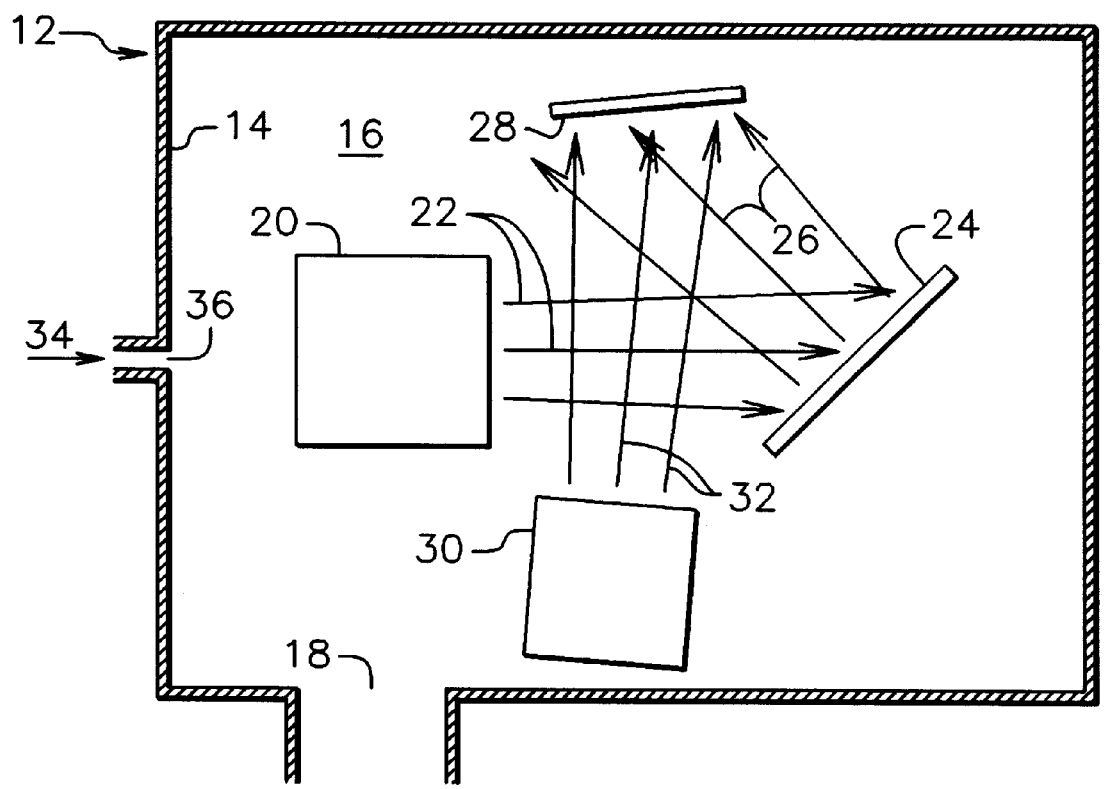
FIG. 1 is a schematic drawing of a prior-art apparatus for the ion assisted deposition of thin films.

Referring to FIG. 1, there is shown a schematic representation of prior art apparatus 12. As is customary with apparatus for ion assisted deposition, a vacuum enclosure 14 surrounds an evacuated volume 16, which is maintained at a rarefied pressure by pumping through a port 18. Within the evacuated volume is an ion source 20 which generates a beam of energetic ions 22. The energetic ions strike a sputter target 24, causing a flux of sputtered particles 26 to be emitted. Some of these sputtered particles strike a deposition substrate 28, causing a thin film of target material to be deposited thereon. Prior to, during, or after the deposition, a second ion source 30 generates a second beam of energetic ions 32 which impinges upon the deposition substrate 28. Most ion assisted deposition processes use bombardment of the substrate 28 by energetic ions 32 simultaneously with the deposition of the sputtered particles 26 on that substrate. However, bombardment prior to or after the deposition can impart special benefits. For example, bombardment prior to deposition can improve adhesion of the thin film to the substrate. Regardless of when the ion assist function takes place, low ion energies are important to avoid damage to either the film that is being deposited or the substrate surface upon which it is deposited. It is also necessary that sufficient ion energy, measured in eV/atom, be available to produce the desired effect.

Depending on the particular devices used in FIG. 1, there may be individual supplies of gas to ion sources 20 and 30, or there may be only a single gas supply 34 to the evacuated volume 16 through port 36 in the enclosure 14.

Multiple supplies of gas generally increase the overall gas load and therefore the pumping requirements. A gas supply to the entire evacuated volume is generally associated with excessive pressure at the deposition substrate and therefore contamination of the deposited film.

Different devices may be used to carry out the ion assisted deposition process indicated in FIG. 1. The ion sources 20 and 30 may be discrete ion sources either of the gridded type as described in an article by Kaufman, et al., in the *AIAA Journal,* Vol. 20 (1982), beginning on page 745, or of the gridless type as described in U.S. Pat. No. 4,862,032—Kaufman, et al. With such discrete ion sources, FIG. 1 would represent the actual disposition of devices to achieve the desired process. Using separate devices for the separate deposition and ion assist functions can result in bulky, complicated, and expensive apparatus, as well as excessive total gas flow.

Alternatively, the sputtering function accomplished by ion source 20, ion beam 22, and target 24 may be accomplished by a single device such as a cathodic arc as described in U.S. Pat. No. 5,279,723—Falabella, et al, or a magnetron as described in the article by Thornton in the *Journal of Vacuum Science and Technology,* Vol. 15 (1978), beginning on page 171. In a similar manner, the ion assist function may be accomplished simply by biasing the deposition substrate 28, so that ions are drawn from an ambient plasma within the evacuated volume 16 and no discrete second ion source is required. In such an alternative implementation of the ion assisted deposition process, FIG. 1 becomes a functional representation, rather than a physical representation of the devices actually used. In the case of a cathodic arc, although several functions are included in the cathodic-arc apparatus, the overall apparatus is complicated and expensive. In the case of a magnetron, the higher background pressure required for its operation increases the likelihood of contamination being included in the film being deposited.

All aspects of ion assisted deposition are integrated in the apparatus described in U.S. Pat. No. 4,911,814—Matsuoka, et al. The resulting apparatus, however, is bulky, complicated, and expensive. It requires two sputter targets, a dielectric window that must be protected from sputtered material, and an electromagnet sufficient to generate a magnetic field of about 875 gauss over a substantial volume of the discharge region.

DESCRIPTION OF THE PREFERRED EMBODIMENTS

Figure 2:
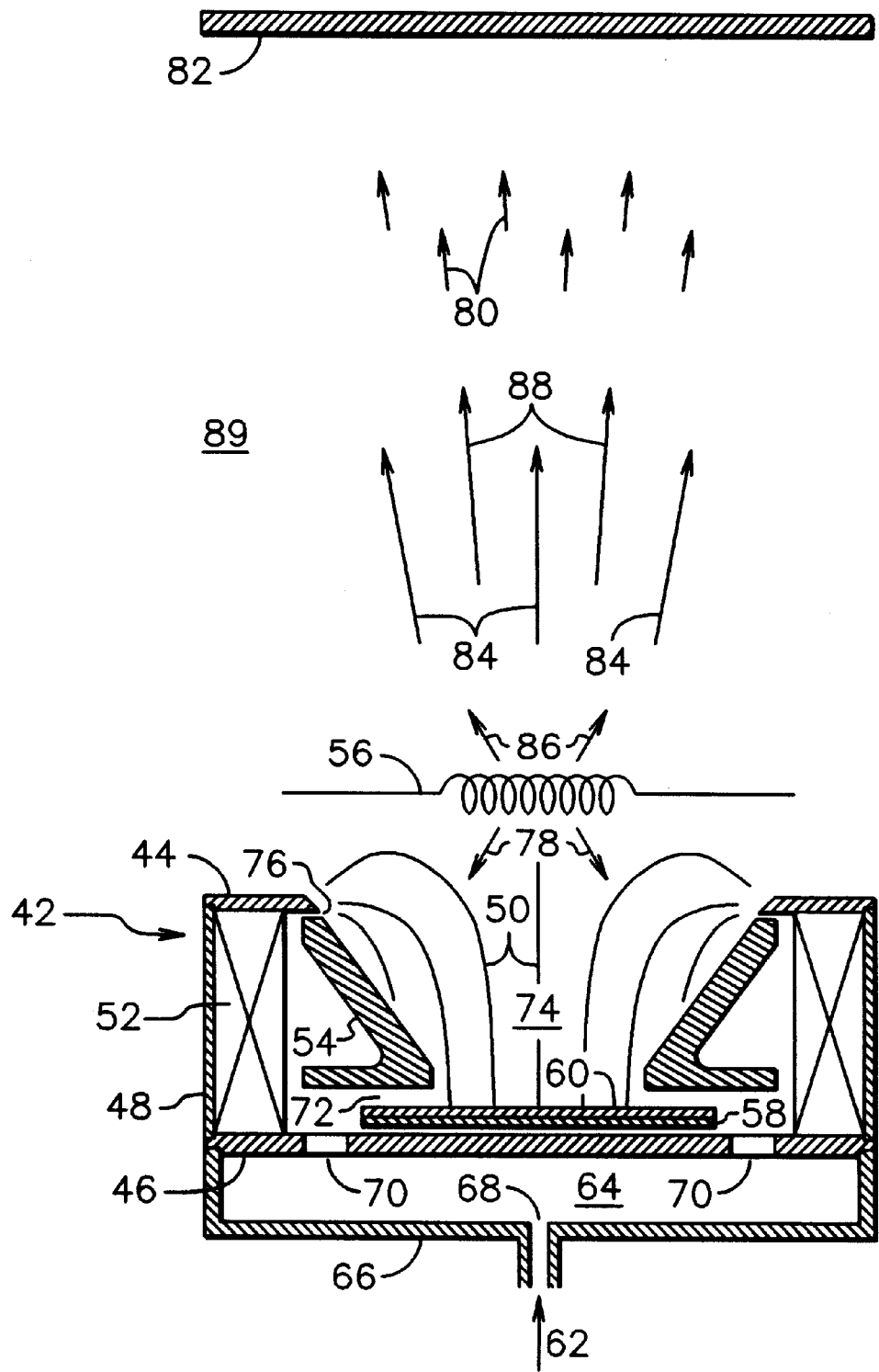
FIG. 2 is a schematic cross-sectional view of the ion assisted deposition source constructed in accordance with one specific embodiment of the present invention.

FIG. 2 represents an approximately axisymmetric ion assisted deposition source 42 that is one embodiment of the present invention. There is a magnetically permeable outer pole piece 44 with an annular shape, a magnetically permeable inner pole piece 46 with a circular shape, and a magnetically permeable connecting member 48, with all aforesaid permeable members having a magnetic permeability substantially greater than unity. The magnetic field 50 extends between pole pieces 44 and 46 and is generated by magnet winding 52. There is an anode 54, an electron emitting cathode 56, and a target support 58, spaced one from another, respectively, as well as each being spaced from the pole pieces 44 and 46. The sputter target 60 is in physical contact with the target support 58. An ionizable gas 62 is introduced into volume 64 formed by enclosure 66 and inner pole piece 46 through port 68 in enclosure 66. The ionizable gas then flows through ports 70 in inner pole piece 46, through annular opening 72 between anode 54 and target 60 to reach discharge region 74. Discharge region 74 is open at a first end, enclosed laterally by anode 54, and enclosed at a second end by target 60. The increase in diameter of the interior wall of the anode 54 toward the open first end of discharge region 74 establishes the shape of that discharge region. The volume 64, the multiple ports 70, and the annular opening 72 all serve to assure that the ionizable gas reaches the discharge region 74 in a circumferentially uniform manner. The opening 76 between outer pole piece 44 and anode 54 is small compared to the opening 72 so that almost all of the ionizable gas flows through opening 72.

Anode 54 is at a positive potential relative to ground, which is defined as the potential of the surrounding vacuum enclosure, not shown in FIG. 2 but similar to vacuum enclosure 14 shown in FIG. 1. The potential of the surrounding vacuum enclosure is usually at earth ground, but may be at some other potential for special purposes. The potential of electron emitting cathode 56 is typically near ground but is sometimes biased negative of the surrounding enclosure to increase electron emission.

Some, typically most, of the electrons 78 from cathode 56 flow to the discharge region 74, where they are confined by the magnetic field 50 in discharge region 74 until they have collisions with atoms or molecules of the ionizable gas and, through these collisions, diffuse to the anode 54. Some of these collisions generate ions which, together with the electrons, form a quasi-neutral discharge plasma. Ions near the target 60 are attracted to this target by the negative potential relative to cathode 56 thereon. The collisions of these ions with the target cause the sputtering of target material atoms 80 that impinge on the exposed surface of the deposition substrate 82. Ions 84 are accelerated from the discharge region toward the substrate 82 by electric fields in the discharge plasma which, in turn, are generated by the potential difference between the anode and the electron emitting cathode. These electric fields are generated in part by the variation in strength of the magnetic field 50, which increases in the direction from the open end of discharge region 74 near electron emitting cathode 56 to the target 60, i.e., parallel to the magnetic field direction in FIG. 2. There are also electric fields in the discharge plasma that are generated by the conduction of electron currents transverse to the magnetic field direction. The relationships governing these electric fields, both parallel and transverse to the magnetic field direction, are taught in the aforesaid U.S. Pat. No. 4,862,032—Kaufman, et al., incorporated herein by reference. The acceleration of ions in a quasi-neutral discharge plasma, in which both electrons and ions are present, permits large ion currents to be accelerated at low (less than 200 eV/ion) ion energies. This process differs sharply from an electrostatic one in that the latter has only ions present and thus requires high voltages to accelerate large ion currents.

The density of accelerated ions 84 is sufficient to require neutralizing electrons, which are supplied by the remaining electrons 86 emitted from cathode 56. Ions 84 together with electrons 86 comprise an ion beam. The bombardment by ions 84 of the thin film deposited by atoms 80 on substrate 82 results in enhanced properties of that film, such as increased adhesion to the substrate and increased density of the deposited film. As discussed in the Background Art section, it is necessary (1) that the ions performing the ion assist function arrive with sufficient total energy, in eV/atom, to perform the desired function as well as (2) that the ions arrive with a low enough energy, in eV/ion, that the deposited film and the surface upon which it is deposited are not damaged. For the latter requirement, the ion energy should be 200 eV/ion or less.

Some of the sputtered atoms of target material become ionized while passing through discharge region 74, and are accelerated by the same electric fields that accelerate ionized gas atoms. The energetic ions reaching substrate 82 thus consist of target material ions 88 in addition to ions 84. The relative proportion of target material atoms 80 and target material ions 88 will depend on the density of target material atoms in the discharge region 74, the ionization cross section of those atoms, and the energy distribution of electrons in that region.

The accelerated target material ions 88 can, from a general viewpoint, be expected to perform the functions of both target material atoms 80 and energetic ions 84 of the ionizable gas. However, there will always be some energetic ions 84 of ionizable gas that become imbedded in the film that is deposited on the substrate 82. There is therefore a purity advantage in supplying the ion assist energy with ions of the same material that is being deposited.

Discharge region 74 within ion assisted deposition source 42 is at a pressure sufficiently elevated to sustain a discharge. The ion assisted deposition source is surrounded by region 89, which is within the vacuum enclosure but exterior to the source. The introduction of the ionizable gas through the source together with the pumping of this gas from the enclosure results in a substantially lower pressure in region 89 compared to that in discharge region 74. Deposition substrate 82 is located in region 89. This location results in a lower pressure for the deposited film, hence a reduced inclusion of impurities, than if the pressure were the same as that in discharge region 74.

As is well-known in the sputtering art, additional cooling beyond that provided by radiation is often required. For example, in the embodiment shown in FIG. 2, the anode 54 and the target support 58 may require water cooling. The additional parts required to provide water cooling have been omitted in the interests of clarity.

The preceding discussion of FIG. 2 implies that target 60 is a conductor and that the bias applied to target support 58 and target 60 is a direct-current potential. It should be noted that the target 60 may also be an insulator. For such a target, the target bias applied to the target support 58 should be a radiofrequency bias. The time-averaged current to the exposed surface of target 60 should then be zero. As is well-known from studies of radiofrequency diodes (see chapter 4 by L. Maissel in *Handbook of Thin Film Technology* (L. I. Maissel and R. Glang, eds.) McGraw-Hill Book Company, New York), the zero time-averaged current is achieved with very short portions of the cycles during which there is a net collection of the more mobile electrons, and much longer portions of the cycles during which there is a net collection of the much less mobile ions. In this manner, the time-averaged voltage of the exposed surface of the target 60 is sufficiently negative to achieve sputtering.

Note that the gas flow of the embodiment shown in FIG. 2 is minimized by the use of a single device to accomplish both the sputter deposition and ion assist functions. Further, the deposition substrate is exterior of both the discharge region and the source, and can therefore be in a region with lower pressure than is required to sustain a discharge. This lower pressure tends to minimize contamination of the deposited film.

Figure 3:
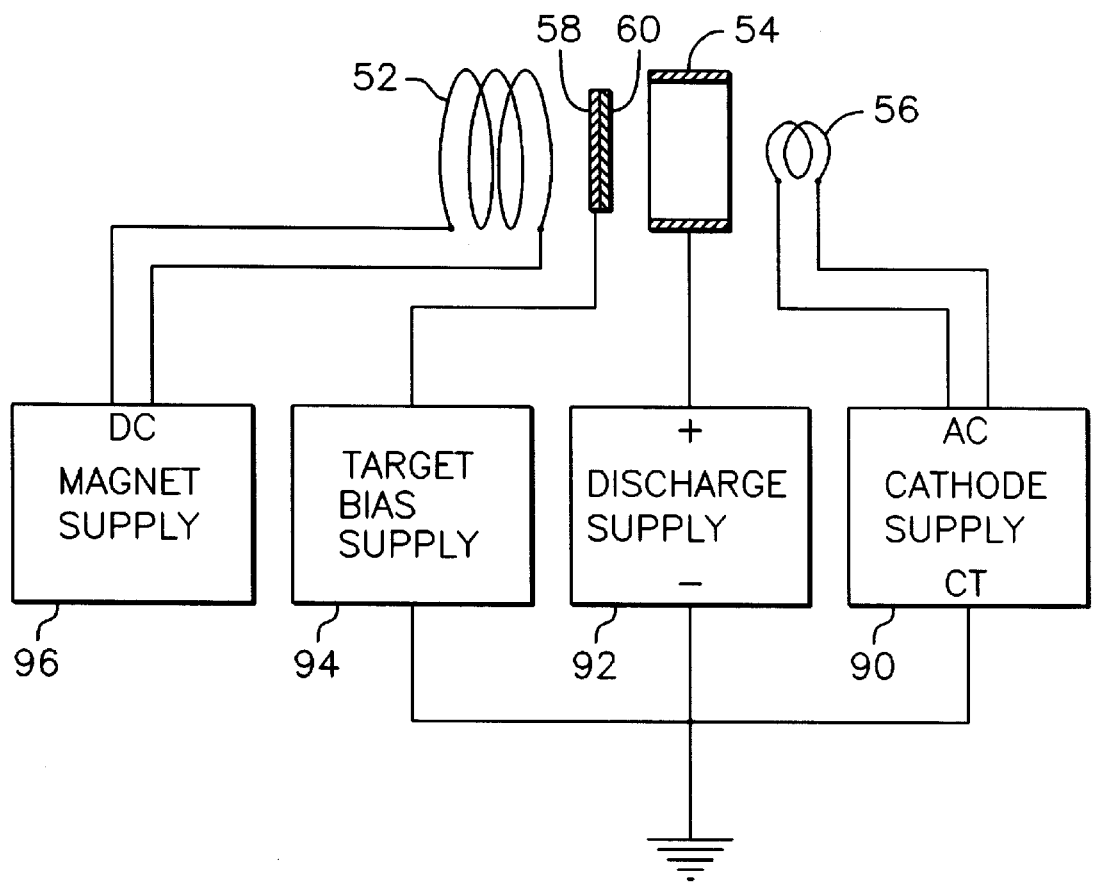
FIG. 3 is an electrical schematic of the specific embodiment of the present invention shown in FIG. 2.

Control of the embodiment of the present invention indicated in FIG. 2 can be understood with reference to the electrical schematic shown in FIG. 3. Therein is schematically shown a magnet winding 52, an anode 54, an electron emitting cathode 56, a target support 58, and a sputter target 60, as well as a cathode supply 90, a discharge supply 92, a target bias supply 94, and a magnet supply 96. The cathode supply 90 provides for operation of the cathode. In FIG. 3, the cathode 56 is indicated schematically to be a hot filament thermionic emitter. In this case the cathode supply furnishes the heating power required for the cathode to reach a thermionic emitting temperature, and is typically a secondary winding of a transformer with the center tap of that secondary winding connected to ground. Regardless of the type of cathode and the specific circuit used, the cathode potential is normally close to ground, which is typically the potential of the enclosure surrounding the evacuated volume. The discharge supply 92 establishes the potential difference between the anode 54 and the cathode 56. For a conducting target 60, the target bias supply is a direct-current supply and it biases the target 60 negative of ground and thereby determines the energy of the ions extracted from the discharge plasma to strike the target. For a target 60 that is an insulator, the bias to the target support 58 is a radiofrequency bias, as described above. The magnet supply energizes the magnet winding 52. The establishment of the desired voltage and current for the discharge supply 92 requires the simultaneous adjustment of the discharge supply and the flow rate of the ionizable gas (shown as 62 in FIG. 2). The discharge current approximately determines the current density of ions leaving the source (shown as ions 84 in FIG. 2). The discharge voltage approximately determines the energy of these ions. The discharge current also approximately determines the current density of ions reaching the target 60, while the bias supply voltage determines the energy of these latter ions.

For a given discharge current, then, the energy of the ions striking the deposition substrate (shown as ions 84 in FIG.

2) is determined by the discharge voltage, and the arrival rate of sputtered atoms (shown as atoms 80 in FIG. 2) is determined by target bias voltage. The rate of deposition is thus adjustable relative to the energy and arrival rate of the ions used in the ion assisted deposition. For example, the deposition rate would be greatly reduced or eliminated by removing the bias from target 58 and permitting it to electrically float. Such operation would permit the surface of the substrate to be cleaned prior to deposition of a thin film.

Although the pole pieces 44 and 46 in FIG. 2 are normally operated at ground potential, their potential can also be adjusted to minimize their sputter erosion and thereby reduce the contamination in the deposited film.

The prior art apparatus of cathodic arcs bears a superficial resemblance to the preferred embodiment shown in FIG. 2 and described above. That is, in the aforementioned U.S. Pat. No. 5,279,723—Falabella, et al., there is an electrical discharge in the presence of a magnetic field and material is dispersed from a negatively biased target to be deposited on a substrate. It is important, however, to recognize the fundamental differences in operation. In a cathodic arc, the electrical discharge is between the anode and the negatively biased target, and the dispersion of target material results from the arc discharge to the target. It is the arc discharge to the target that is also responsible for the production of undesirable macroparticles in the cathodic arc.

In the apparatus of FIG. 2, the electrical discharge is primarily between anode 54 and electron emitting cathode 56. There is a current to sputter target 60 as the result of the electrical bias of that target, but that current is smaller than the current to the electron emitting cathode. The discharge process is thus primarily controlled by the voltage and current between the anode 54 and electron emitting cathode 56. The electron emission from the sputter target 60, due to secondary electrons from the ionic collisions, is small compared to the ionic current and is clearly of secondary importance to the discharge process. These operating characteristics are substantially different from those of the cathodic arc and, consistent with these differences, no macroparticles have been observed in the films deposited with apparatus similar to that shown in FIG. 2. They are also substantially different from those of a magnetron, where the current to the sputter target is the discharge current and the sputtering cannot be initiated or terminated without initiating or terminating the discharge.

Figure 4:
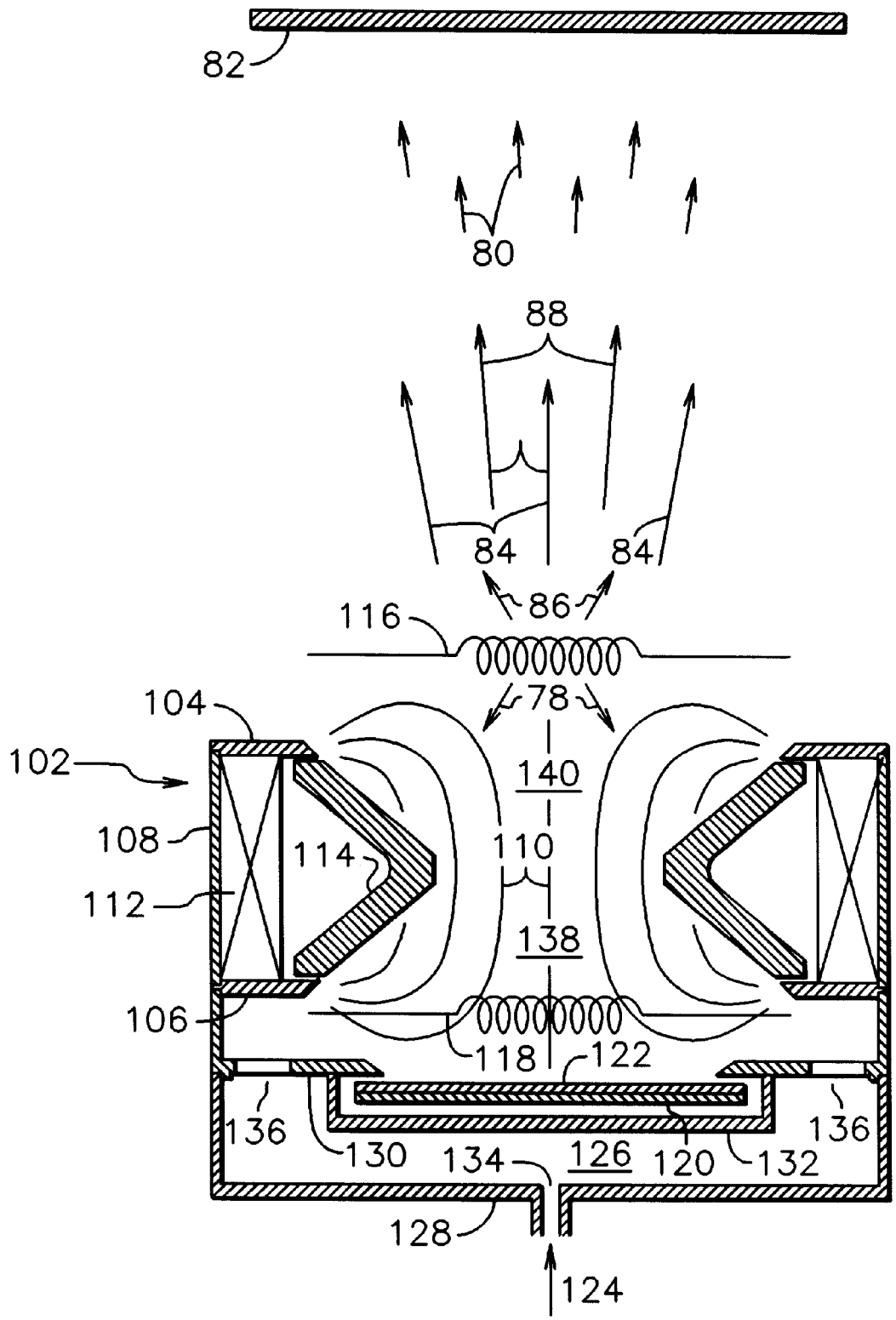
FIG. 4 is a schematic cross-sectional view of the ion assisted deposition source constructed in accordance with another specific embodiment of the present invention.

FIG. 4 shows an approximately axisymmetric deposition source 102 that is another embodiment of the present invention. There is a magnetically permeable outer pole piece 104, a magnetically permeable inner pole piece 106, and a magnetically permeable connecting member 108. The magnetic field 110 extends between pole pieces 104 and 106 and is generated by magnet winding 112. There is an anode 114, an electron emitting cathode 116, an electron emitting cathode 118 in an alternate location, a target support 120, and a sputter target 122. An ionizable gas 124 is introduced into volume 126 formed by gas enclosure 128, discharge enclosure 130, and target enclosure 132, through port 134 in enclosure 128. The ionizable gas then flows through ports 136 in discharge enclosure 130 to discharge region 138 approximately enclosed laterally by anode 114 and adjacent to target 122, and then to discharge region 140 also approximately enclosed laterally by anode 114 but farther from target 122. More specifically, region 138 is located between the target 122 and the axial location of the maximum strength of magnetic field 110, while region 140 extends from that location of maximum strength to approximately the open end of the discharge region.

Assuming first that the operation is with cathode 116, some, typically most, of the electrons 78 from cathode 116 flow to the discharge regions 138 and 140, where they are constrained by the magnetic field 110 until they have collisions with atoms or molecules of the ionizable gas and, through the collisions diffuse to the anode 114. Some of the collisions generate ions which, together with the electrons, form a quasi-neutral discharge plasma. Ions near the target 122 are attracted to this target by the negative potential thereon. The collisions of these ions with the target cause the sputtering of target material atoms 80 that impinge on the exposed surface of the deposition substrate 82. Other ions 84 from the discharge region are accelerated toward the substrate 82 by potential gradients in the discharge plasma. The density of ions 84 is sufficient to require neutralizing electrons, which are supplied by the remaining electrons 86 emitted from cathode 116. The bombardment of the thin film deposited by atoms 80 on substrate 82 by ions 84 results in enhanced properties of that film, such as increased adhesion to the substrate and increased density of the deposited film.

Continuing to refer to FIG. 4, the description of operation with electron emitting cathode 118 would be the same as that given above for electron emitting cathode 116. The only difference is in the relative quantities of some processes. The ions that reach sputter target 122 tend to come from discharge region 138, while the ions 84 that bombard the substrate 82 tend to come from discharge region 140. When operating with cathode 116, the density of the discharge in region 140 tends to be higher than the density of the discharge in region 138. Conversely, when operating with cathode 118, the density of the discharge in region 140 tends to be lower than the density of the discharge in region 138. When operating with cathode 116, then, the ratio of bombarding ions 84 to sputtered atoms 80 is higher than when operating with cathode 118. The cathode location can thus change the relative magnitudes of sputtered atoms 80 and bombarding ions 84 arriving at the deposition substrate 82.

As was true of the configuration shown in FIG. 2, some of the sputtered atoms of target material become ionized while passing through discharge region 74, and are accelerated by the same electric fields that accelerate ionized gas atoms. The energetic ions reaching substrate 82 thus consist of target material ions 88 in addition to ionized gas ions 84. The relative proportion of target material atoms 80 and target material ions 88 will depend on the ionization cross section of those atoms and the density and energy distribution of electrons in discharge regions 138 and 140.

ALTERNATE EMBODIMENTS

A variety of alternate embodiments are evident to one skilled in the art. An embodiment similar to that shown in FIG. 4 could be used with both cathode 116 and cathode 118 installed at the same time. Switching the emission from one cathode to the other would permit the relative magnitudes of sputtered atoms 80 and bombarding ions 84 arriving at the deposition substrate 82 to be adjusted over a wider range than would be possible with only a single cathode.

As additional embodiments, a variety of electron emitting cathodes can be used. A hot filament thermionic emitter must be placed in a region with a sufficiently dense plasma to provide electrical conductivity from the hot filament to the plasma, either in the beam of accelerated ions or in the discharge region itself. The cathode locations shown in FIG. 2 and FIG. 4 are consistent with hot filament cathodes.

The hollow cathode and the plasma bridge cathode both emit an electrically conductive plume of plasma, permitting the cathode to be located outside of the discharge region and outside of the flow of ions from said region. A typical location for these types of cathodes is near a beam of accelerated ions, but outside of it to reduce the ion impingement upon and the erosion of the cathode.

One skilled in the art of using different types of cathodes will thus recognize that the optimum cathode locations will differ for different types of cathodes.

Sputter targets that are either conductors or insulators have been considered. Sputter targets may also be magnetically permeable. In the embodiment shown in FIG. 2, the target 60 is both close and parallel to inner pole piece 46. Those skilled in the art of magnetic fields will recognize that the presence of a magnetically permeable target 60 in this location will have only a moderate effect on the shape of the magnetic field 50. In FIG. 4, the target 122 is located in a region of low magnetic field strength, so that a magnetically permeable target in this location will have only a moderate effect on the magnetic field near the anode 114, and it is the magnetic field near the anode which determines the discharge characteristics of the deposition source. The embodiments of both FIG. 2 and FIG. 4 can therefore operate with targets that are magnetically permeable.

Those skilled in the art of magnetic fields should also recognize that the magnetic fields can be generated by permanent magnets rather than electromagnets.

Those skilled in the art of plasma devices will recognize that additional elements may be useful beyond those shown in FIGS. 2 and 4. For example, floating electrodes may be used to contain the plasma while minimizing sputtering therefrom. As another example, additional elements may be required to protect supporting insulators from sputtered material within the source.

While the descriptions of the preferred embodiments have used axisymmetric configurations with the accelerated ions moving in a direction generally parallel to the axis of symmetry, other possibilities should be readily apparent. As one example, the configuration can be axially symmetric, but with the ions accelerated in the generally radial direction. As another example, the region in which the gas is ionized and accelerated, instead of being circular in shape, can be of an elongated or rectangular shape. Other possibilities of tailoring the configuration to specific needs should be readily apparent.

SPECIFIC EXAMPLE

As a specific example of operation, a configuration similar to that shown in FIG. 2 was operated with an inner diameter of the outer pole piece of 38 mm, a separation of inner and outer pole pieces of 39 mm, an anode height of 28.5 mm, an inner anode diameter of 38 mm, and a copper target and its support that together were 3 mm thick and spaced 1 mm from the inner pole piece. The spacing between the anode and the outer pole piece was 1 mm or less. The cathode was a tungsten filament located 12 mm beyond the outer pole piece and with a diameter of 0.51 mm. The heating current to the filament was approximately 20 amperes. With a magnetic field strength at a location both on axis and adjacent to the inner pole piece of 240 Gauss ($2.4 \times 10^{-2}$ Tesla), a discharge voltage of 60 volts, a discharge current of 2 amperes, and a direct-current target bias of −250 volts, at an argon flow of 42.5 standard cubic centimeters per minute and a background pressure of $4.6 \times 10^{-4}$ Torr (0.061 Pascal), the deposition rate for copper at a substrate located 200 mm from the upper pole piece was 49 angstroms per minute. The current density of ions arriving at the substrate was 1.02 milliamperes per $cm^2$. From these values, the ion-to-atom arrival rate can be calculated as 9.3. With a mean ion energy of 5.3 electron-volts, the ion bombardment energy was 49 electron-volts per atom.

The range of 1–100 electron-volts/atom was indicated as the range of interest for the modification of thin film properties in the aforementioned article by Harper, et al., beginning on page 127 in the book *Ion Bombardment Modification of Surfaces: Fundamentals and Applications*, O. Auciello and R. Kelly, eds. The value of 49 electron-volts/per atom is thus well into the range where useful property modification can be expected. Further, it achieves this result with low energy ions (less than a maximum of about 60 electron-volts) so that there is no damage due to the deep penetration of energetic ions.

The current to the sputter target in the above example was about 300 mA. This is 15 percent of the discharge current of 2 A. The coefficient of secondary electron emission depends on the ion and target materials, but is typically of the order of 0.1. The electron emission from the target would thus be expected to be of the order of 1–2 percent of that from the electron emitting cathode. The discharge process is therefore substantially independent of both the current to the target and the electron emission therefrom. No macroparticles were observed in the films deposited with this apparatus.

The fraction of sputtered particles that are ionized can be estimated for the example given above. From the relative residence times for different neutrals and the preferential direction of the ionized particles toward the deposition substrate, it can be estimated that at least three percent of sputtered particles arriving at the deposition substrate are ionized. This does not include the effect of the difference in ionization potential, 7.7 electron volts for copper versus 15.8 for argon, which could perhaps increase that percentage to 10 percent or more. It should be apparent that operating parameters could be optimized to maximize the fraction of sputtered particles that are ionized, such as by operating at a low discharge voltage with a corresponding low electron temperature, thereby increasing the preferential ionization of copper with its low ionization potential.

While particular embodiments of the present invention have been shown and described, and various alternatives have been suggested, it will be obvious to those of ordinary skill in the art that changes and modifications may be made without departing from the invention in its broadest aspects. Therefore, the aim in the appended claims is to cover all such changes and modifications as fall within the true spirit and scope of that which is patentable.

We claim:

1. An ion assisted deposition source comprising:
   means for introducing and distributing a gas, ionizable to produce a plasma, into a first region having first and second ends, wherein said first region is within said source and open at said first end;
   an anode disposed circumferentially around said first region;
   an electron emitting cathode in or near said first region and spaced from said anode;
   a sputter target disposed at said second end of said first region and spaced from said anode and said cathode;
   means for impressing a potential difference between said anode and said cathode to cause some of the electrons emitted from said cathode to flow generally from said cathode to said anode and bombard said gas to create said plasma which comprises ions and electrons; wherein said potential difference is sufficient to accelerate ions leaving said first end of said first region with an energy of less than 200 eV/ion, wherein said ions together with the remaining electrons emitted from said electron emitting cathode comprise an ion beam;

means included within said source for establishing within said first region a magnetic field with a strength and shape adequate to confine the electrons from said cathode in said first region; wherein said means for establishing a magnetic field includes a material with a magnetic permeability substantially greater than unity to share and control the strength within said magnetic field;

means for impressing a potential difference between said target and said cathode to cause some of the ions from said plasma to flow from said plasma to said target and bombard said target to create sputtered particles of target material; and a deposition substrate upon which said sputtered particles of target material are deposited and at which said ion beam is directed, wherein said deposition substrate is exterior of said first region and is located in a second region of lower pressure than said first region.

2. An ion assisted deposition source as defined in claim 1 in which said means for impressing a potential difference between said target and said cathode comprises a radiofrequency generator.

3. An ion assisted deposition source as defined in claim 1 further comprising (a) an additional electron emitting cathode within said magnetic field and (b) means for impressing a potential difference between said anode and said additional cathode to cause some of the electrons to flow generally from said additional cathode to said anode and bombard said gas to create said plasma.

4. An ion assisted deposition source as defined in claims 1, 2, or 3, wherein said magnetic field has a strength which increases from said first end of said first region to said target.

5. An ion assisted deposition source as defined in claims 1, 2, or 3 wherein said magnetic field has a strength which increases to a maximum and then decreases from said first end of said first region to said target.

6. An ion assisted deposition source as defined in claims 1, 2, or 3 in which at least one additional element is electrically isolated from said anode, said electron emitting cathode, and said sputter target.

7. An ion assisted deposition source as defined in claims 1, 2, or 3 in which said anode is generally axially symmetrical with an interior wall that increases in diameter toward said first end of said first region.

8. An ion assisted deposition source as defined in claim 7 in which said means for establishing a magnetic field includes an annular pole piece near said first end of said first region and a circular pole piece near said target.

9. An ion assisted deposition source as defined in claim 7 in which said means for establishing a magnetic field includes a first annular pole piece near said first end of said first region and a second annular pole piece displaced from said first annular pole piece toward said target.

10. An ion assisted deposition source as defined in claims 1, 2, or 3 in which said cathode is electrically heated by an additional external power source and is located outside of said first region and within said ion beam from said first end of said first region at a location where said magnetic field has a strength which is low relative to that of said field within said first region.

11. An ion assisted deposition source as defined in claims 1, 2, or 3 in which said cathode emits an electrically conductive plume of plasma and is located outside of said first region and outside of said ion beam from said first end of said first region at a location where said magnetic field has a strength which is low relative to that of said field within said first region.

12. An ion assisted deposition source comprising:

means for introducing and distributing a gas, ionizable to produce a plasma, into a first region having first and second ends, wherein said first region is within said source and open at said first end;

an anode disposed circumferentially around said first region; wherein said anode is generally axially symmetrical with an interior wall that increases in diameter toward said first end of said first region;

an electron emitting cathode in or near said first region and spaced from said anode;

a sputter target disposed at said second end of said first region and spaced from said anode and said cathode;

means for impressing a potential difference between said anode and said cathode to cause some of the electrons emitted from said cathode to flow generally from said cathode to said anode and bombard said gas to create said plasma which comprises ions and electrons; wherein said potential difference is sufficient to accelerate ions leaving said first end of said first region with an energy of less than 200 eV/ion, wherein said ions together with the remaining electrons emitted from said electron emitting cathode comprise an ion beam;

means included within said source for establishing within said first region a magnetic field with a strength and shape adequate to confine the electrons from said cathode in said first region;

means for impressing a potential difference between said target and said cathode to cause some of the ions from said plasma to flow from said plasma to said target and bombard said target to create sputtered particles of target material; and a deposition substrate upon which said sputtered particles of target material are deposited and at which said ion beam is directed, wherein said deposition substrate is exterior of said first region and is located in a second region of lower pressure than said first region.

* * * * *